(12) United States Patent  
Ono

(10) Patent No.: US 6,283,041 B1  
(45) Date of Patent: ***Sep. 4, 2001

(54) TABLE SUPPORT APPARATUS AND EXPOSURE APPARATUS

(75) Inventor: Kazuya Ono, Yokohama (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/196,102

(22) Filed: Nov. 20, 1998

(30) Foreign Application Priority Data

Nov. 21, 1997 (JP) .................................................. 9-320793

(51) Int. Cl.⁷ .................................................. A47B 85/00
(52) U.S. Cl. ............................................. 108/20; 248/562
(58) Field of Search ..................................... 108/137, 143, 108/57.12, 20; 240/567, 638, 560; 74/16

(56) References Cited

U.S. PATENT DOCUMENTS

| | | | | |
|---|---|---|---|---|
| 4,200,256 | * | 4/1980 | Thiel | 248/562 X |
| 4,371,143 | * | 2/1983 | Ishida et al. | 248/562 X |
| 4,596,373 | * | 6/1986 | Omi et al. | 248/562 |
| 5,031,547 | * | 7/1991 | Hirose | 108/137 X |
| 5,036,723 | * | 8/1991 | Matsumoto | 108/137 X |
| 5,477,304 | | 12/1995 | Nishi . | |
| 5,595,430 | * | 1/1997 | Weyeneth | 248/562 X |
| 5,685,232 | * | 11/1997 | Inoue | 108/20 |
| 5,773,837 | | 6/1998 | Nakasuji . | |

* cited by examiner

*Primary Examiner*—Jose V. Chen  
(74) *Attorney, Agent, or Firm*—Nixon & Vanderhye P.C.

(57) ABSTRACT

On a sample stand having a chip levelling mechanism for amending the exposure plane of a wafer in relation to the image plane of a projection lens, a dynamic damper is provided for assigning to a holder table the appropriate rigidity in the moving direction of the holder table.

25 Claims, 15 Drawing Sheets

TABLE SUPPORT APPARATUS AND EXPOSURE APPARATUS

BACKGROUND OF THE INVENTION

1. Field of the Invention

The present invention relates to an appropriate table support apparatus for a wafer stage with a projection exposure apparatus or an EB (electron beam) exposure apparatus for production of semiconductor elements.

2. Description of the Related Art

In the projection exposure apparatus or the EB (electron beam) exposure apparatus for production of semiconductor elements, a wafer is automatically transferred to a sample stand and fixed to a wafer holder. It is apparently flat, but is actually subject to a slight warp or distortion from processes such as a high-temperature process, etc. At some points, an exposure plane is not vertical to the optical axis of a projection lens. Therefore, a sample stand is equipped with a chip levelling mechanism for amending the tilt of the exposure plane of the wafer in relation to an image plane of the projection lens.

FIG. 1 shows an example of a sample table equipped with a chip levelling mechanism. A sample table 1 includes a base 2 fixed to an XY stage; a plurality of vertically flexible and, for example, piezoelectric drives device 3 mounted on the base 2; a holder table 4 supported by each drive device 3; a wafer holder 5, provided on the holder table 4, for holding a wafer W by adsorption; a leaf spring 6, horizontally mounted between the base 2 and the holder table 4, for locking the holder table 4 in a horizontal state; a moving mirror 7; a laser interferometer 8; and a sensor 9. With the above described configuration, the exposure plane of the wafer W is amended in relation to the image plane of the projection lens by moving the holder table 4 up and down or tilting the holder table 4 in an optional direction by appropriately adjusting the amount of drive of each drive device 3.

The sample table 1 further includes a damper mechanism 10 for damping the vibration generated at the holder table 4 when the level of the exposure plane is adjusted. The damper mechanism 10 is provided between the base 2 and the holder table 4, and damps the vibration of the holder table 4 based on the viscosity of a viscoelastic substance. Furthermore, the position of the holder table 4 in the X and Y directions is measured by the laser interferometer 8.

Recently, a larger wafer is designed, and a sample stand is designed in a way that a holder table can be responsive and better in movement when the level of the exposure plane is adjusted. However, in the sample stand having the above described damper mechanism, the holder table is strongly held in the opposite direction of its movement with the resistance of a viscoelastic substance when a level adjustment is made, thereby having the holder table deformed. Since the resistance to the holder comes from the viscosity of the viscoelastic substance, the holder table can recover from the deformation with time. However, the exposure plane cannot be correctly aligned until the holder table can be free of deformation. This is a problem in improving the responsiveness of the holder table.

SUMMARY OF THE INVENTION

The present invention has been developed to solve the above described problem, and aims at improving the responsiveness of the holder table when the level of the exposure plane is adjusted by absorbing the vibration of the holder table without deformation of the holder table when the level is adjusted, and by solving the problem of the delay due to the deformation of the holder table in aligning the exposure plane.

The table support apparatus according to the present invention includes a table and a dynamic damper.

According to the first aspect of the present invention, the table is movable in at least one optional direction. The dynamic damper is provided on the table.

The exposure apparatus according to the present invention includes a table and a dynamic damper.

According to the second aspect of the present invention, the table is movable at least in one optional direction to align the exposure plane of a sample to be exposed on the table in relation to the image plane of a projection lens. The dynamic damper is provided on the table to damp the vibration generated on the table.

BRIEF DESCRIPTION OF THE DRAWINGS

Other purposes and features of the present invention are readily comprehensible to one skilled in the art from the attached drawings and the explanation of the preferred embodiments.

DETAILED DESCRIPTION OF THE PREFERRED EMBODIMENTS

Figure 1:
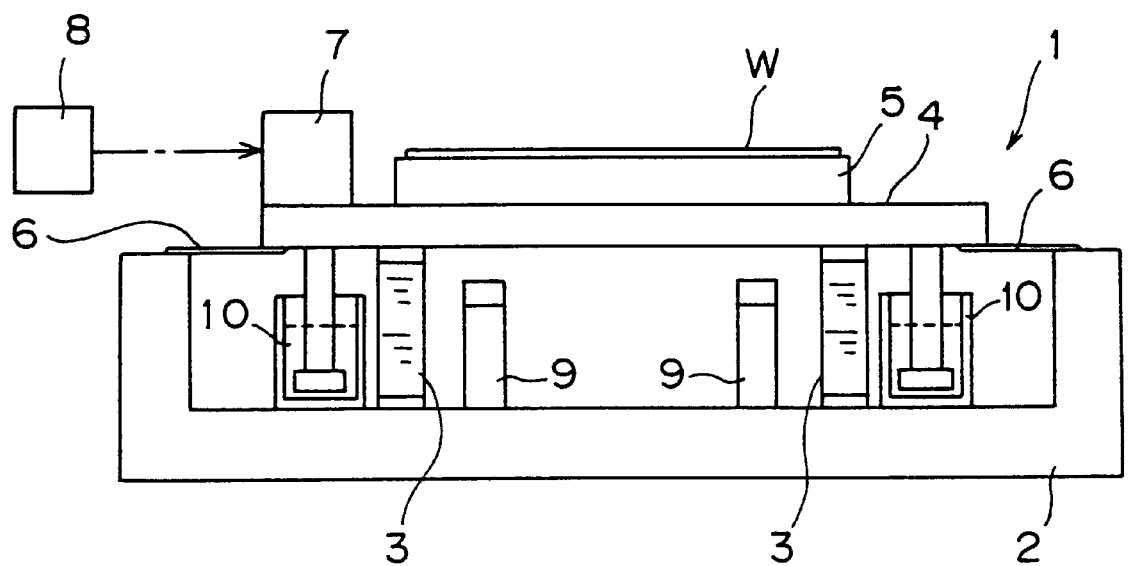
FIG. 1 is a side view showing an example of a conventional sample stand.

The present invention will be more apparent from the following detailed description, when taken in conjunction with the accompanying drawings.

To solve the above described problem with the prior art technology, a dynamic damper is provided in the holder table according to the present invention. A dynamic damper has the function of vibrating itself according to the vibration generated by a structure to absorb it by attaching the dynamic damper to the structure to be vibration-damped without any coupling unit. If this dynamic damper is used as a mechanism for damping the vibration of the holder table set as movable in at least one optional direction, then the vibration of the holder table can be controlled without a deformation of the holder table because the base is not coupled with the holder table.

The dynamic damper is assigned an appropriate rigidity for damping the vibration at least in the moving direction of the holder table. When the mode of the vibration of the holder table is analyzed at the level adjustment, each unit of the holder table waveringly vibrates in the moving direction, and the frequency of the holder table is determined. Therefore, the natural frequency of the dynamic damper in the vibration direction of the holder table is set to match the frequency of the holder table so that the vibration energy of the holder table enters the state in which the vibration energy is absorbed by the dynamic damper, thereby suppressing the vibration of the holder table.

The dynamic damper is designed to include a base attached to the holder table; an elastic substance which has appropriate rigidity in the moving direction of the holder table and is attached to the base on both sides in the moving direction of the holder table; and a mass body designed as a unit mounted to the base on both sides in the holder table in the moving direction, connected to each other, with each elastic substance provided between the base and the mass body. When the holder table starts vibrating, a vibration system comprising the elastic substance and the mass body is excited to generate a vibration suppressive effect, thereby suppressing the vibration of the holder table.

In the dynamic damper, the shape and the material of the elastic substance can be appropriately selected so that the rigidity can be set low for the vibration provided for the holder table by the operation of, for example, an XY stage in the horizontal direction, or the rotation-vibration around the vertical axis, and so that the vibration suppressive effect does not work against the above described vibration. As a result, the entire vibration control can be easily performed when the holder table is actually operated. For the holder table, the vibration mode is analyzed in six optional directions, that is, two horizontal axis directions (X direction and Y direction), a vertical direction (Z direction), and axis rotation directions (ωx direction, ωy direction, ωz direction). The vibration should be controlled for each optional direction. If a dynamic damper has a vibration suppressive effect only in a specific optional direction as described above, and has no vibration suppressive effect in the other optional directions, then the dynamic damper provided to control the vibration in an optional direction has no influence on the control of the vibration in the other optional directions, thereby easily controlling the vibration in each optional direction.

It is desired that the dynamic damper is fixed to the antinode of a vibration generated on the holder table. At the level adjustment, it is certain that the holder table vibrates waveringly up and down. Therefore, the vibration of the holder table can be effectively suppressed by fixing the dynamic damper to a point vibrating up and down as an antinode of the vibration.

An embodiment of the table support apparatus according to the present invention is described. The present embodiment is realized by applying the table support apparatus to a wafer stage with a scanning type projection exposure apparatus for production of semiconductor elements and exposing a pattern to a wafer while synchronously moving a reticle (mask) having the pattern and the wafer which is an optically sensitive base plate as disclosed by U.S. Pat. No. 5,477,304 or an EB exposure apparatus as disclosed by U.S. Pat. No. 5,773,837. U.S. Pat. No. 5,477,304 and U.S. Pat. No. 5,773,837 are incorporated into the present invention.

Figure 2:
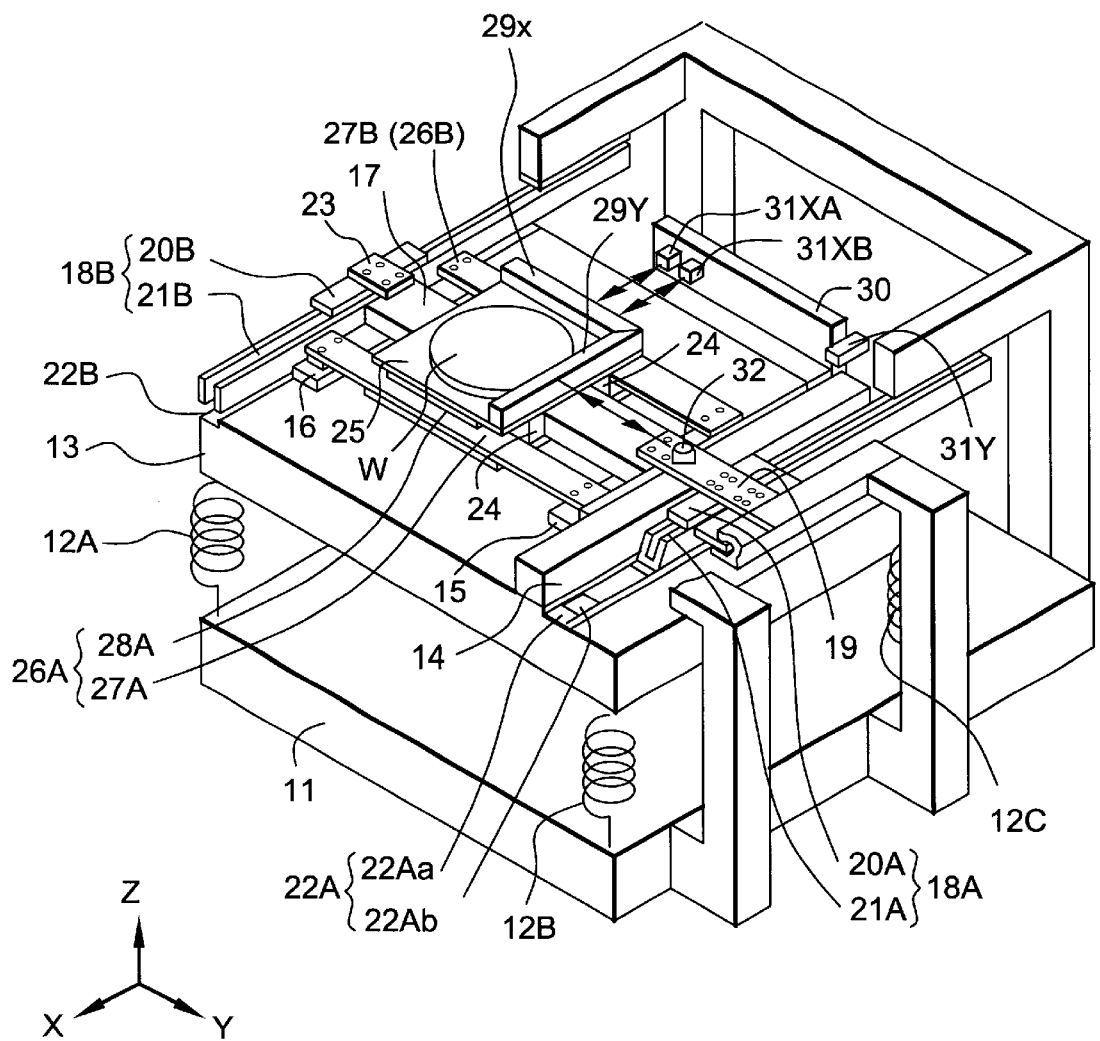
FIG. 2 shows an embodiment of the table support apparatus according to the present invention, and is an oblique view showing a wafer stage with a projection exposure apparatus or an EB exposure apparatus for production of semiconductor elements with the table support apparatus according to the present invention used as a sample stand.

As shown in FIG. 2, a rectangular fixed board 13 is supported through antivibration stands 12A through 12D (an antivibration stand 12D is not shown in FIG. 2) at four points on a planar base 11. Each of the antivibration stands 12A through 12D comprises an elastic air spring (or a coil spring) and an oil damper as a vibration damper. The antivibration stands 12A through 12D prevent the vibration through the floor from being transmitted to the fixed board 13. Additionally, the resonant frequency of the entire mechanism of the fixed board 13 and the projection exposure apparatus or the EB exposure apparatus is adjusted to around a few Hz. The top surface of the fixed board 13 is a plane with high flatness and is held parallel to the level when the apparatus is in an OFF state. In the following explanation, the X and Y axes extend in parallel with the top surface of the fixed board 13, and the Z axis is vertical to the top surface of the fixed board 13.

In this case, an X guide bar 14, which is provided with a guide for the X stage, is fixed to the top surface of the fixed board 13 along the X direction. A first Y guide bar carrier 15 is provided as movable in the X direction along the side of the X guide bar 14 and the top surface of the fixed board 13. A second Y guide bar carrier 16 is provided as movable in the X direction along the top surface of the fixed board 13 in parallel with the first Y guide bar carrier 15. A Y guide bar 17, which is provided with a guide for the Y stage, is mounted in the Y direction to couple the first Y guide bar carrier 15 with the second Y guide bar carrier 16. The first Y guide bar carrier 15, the second Y guide bar carrier 16, and the Y guide bar 17 form the X stage.

In this case, air jet units each forming part of an air bearing are provided at the bottom surface and the outer side of the first Y guide bar carrier 15. Around the air jet units, a pre-pressuring mechanism such as a magnet, a vacuum pocket, etc. is mounted. The first Y guide bar carrier 15 is locked in the Z and Y directions with a predetermined space from the top surface of the fixed board 13 and the side of the X guide bar 14, and is movable in the X direction. Similarly, an air jet unit forming part of an air bearing, and a pre-pressuring mechanism such as a magnet, a vacuum pocket, etc. are mounted onto the bottom surface of the second Y guide bar carrier 16. The second Y guide bar carrier 16 is locked with a predetermined space from the fixed board 13 so that it can be moved in the X direction.

An X axis linear motor 18A is set along the X direction on the fixed board 13 with the X guide bar 14 enclosed by the X axis linear motor 18A and the first Y guide bar carrier 15. The X axis linear motor 18A is coupled with the first Y guide bar carrier 15 through a coupling material 19 mounted as enclosing the X guide bar 14. Furthermore, the X axis linear motor 18A comprises a movable element 20A equipped with a coil on the coupling material 19 side; and a stator 21A having a plurality of permanent magnets arranged such that the polarity changes alternately on the fixed board 13 side. A direct-acting guide 22A is provided between the stator 21A and top surface of the fixed board 13. The direct-acting guide 22A comprises a rail 22A*a* fixed on the fixed board 13; and a plurality of drag materials 22A*b* having dragging movement on the rail 22A*a* in the X direction by means of a number of small ball bearings. The drag materials 22A*b* are fixed to the bottom surface of the stator 21A with an adhesive, etc. The direct-acting guide 22A can be a guide, etc. of a hydrostatic bearing system.

The X axis linear motor 18B arranged in the X direction is coupled with the Y guide bar 17 through a coupling material 23. The X axis linear motor 18B comprises a movable element 20B provided with a coil on the coupling material 23 side, and a stator 21B having a plurality of permanent magnets on the fixed board 13 side. A direct-acting guide 22B, through which the stator 21B has dragging movement back and forth in the X direction, is mounted between the stator 21B and the top surface of the fixed board 13. That is, the stators 21A and 21B of the X axis linear motors 18A and 18B are locked by the direct-acting guides 22A and 22B such that they cannot be moved in the Y direction, but are set to have dragging movement in the X direction. In this case, the stators 21A and 21B are assigned a damping force by a damping material to offset the reaction when they are driven. The X axis linear motors 18A and 18B drive the X stage in the X direction in parallel in the moving coil system.

A pair of X direction locking bearing materials 24 are arranged with a space of at least several $\mu$m at the side of the Y stage in a way that the Y guide bar 17 is set to move in the X direction. A Z direction floating bearing plate (not shown in the drawings) is fixed to the bottom surface of the X direction locking bearing material 24. A sample stand 25 is fixed to the top surface of the X direction locking bearing material 24. A wafer W to be exposed is held on the sample stand 25 through a wafer holder. In the present example, the pair of X direction locking bearing materials 24, the Z direction floating bearing plate, and the sample stand 25 form the Y stage.

In this case, three or more sets of an air jet unit and a pre-pressuring device such as a vacuum pocket, a magnet, etc. (not shown in the attached drawings), forming an air bearing, are incorporated into the bottom surface (opposite the fixed board 13) of the Z direction floating bearing plate. Thus, the weight of the Y stage is supported by the air bearing system. Furthermore, a pair of X direction locking bearing materials 24 are supported by the non-contact air bearing system. Each of the pair of X direction locking bearing materials 24 applies an air jet to the Y guide bar 17, keeps a given gap without contact between the Y stage and the Y guide bar 17 based on the balance between the air pressures of the air jets, and locks the movement in the X direction. As a result, the Y stage is locked in the X and Y directions without contact, and can be moved in the Y direction along the Y guide bar 17.

Stators 27A and 27B each provided with a coil are mounted in parallel with the Y direction to couple the first Y guide bar carrier 15 and the second Y guide bar carrier 16 with both ends of a pair of the X direction locking bearing materials 24 to drive the Y stage. A movable element 28A provided with a plurality of permanent magnets fixed in the shape of 'l' enclosing the stator 27A to the outer side of the X direction locking bearing material 24 on the +X direction side. A movable element (not shown in the drawings) provided with a plurality of permanent magnets is fixed in the shape of 'l' enclosing the stator 27B to the outer side of the X direction locking bearing material 24 on the −X direction side. Y axis linear motors 26A and 26B in the two-axis moving magnet system are designed using the stators 27A and 27B and a corresponding movable element 28A, etc. The Y stage is driven in the Y direction by these Y axis linear motors 26A and 26B.

The position along the Z direction (position for focus) and the tilt angle around the X and Y axes of the sample stand 25 over the X direction locking bearing material 24 on the Y stage can be amended. An X axis moving mirror 29X and a Y axis moving mirror 29Y are fixed to the ends of the sample stand 25 respectively in the −X and +X directions. A laser beam is emitted in parallel with the X axis from two-axes laser interferometers 31XA and 31XB of the X axis attached to a support material 30 fixed to the side in the −X direction on the fixed board 13 to the moving mirror 29X. Laser interferometers 31XA and 31XB obtain the X coordinate of the moving mirror 29X (sample stand 25).

The laser beam from a laser interferometer 31Y of the Y axis attached to the support material 30 is reflected on a mirror 32 attached to the optical system support frame (not shown in the drawings) attached to the support material 30, and is then emitted to the moving mirror 29Y in parallel with the Y axis. The laser interferometer 31Y obtains the Y coordinate of the moving mirror 29Y (sample stand 25).

Figure 3:
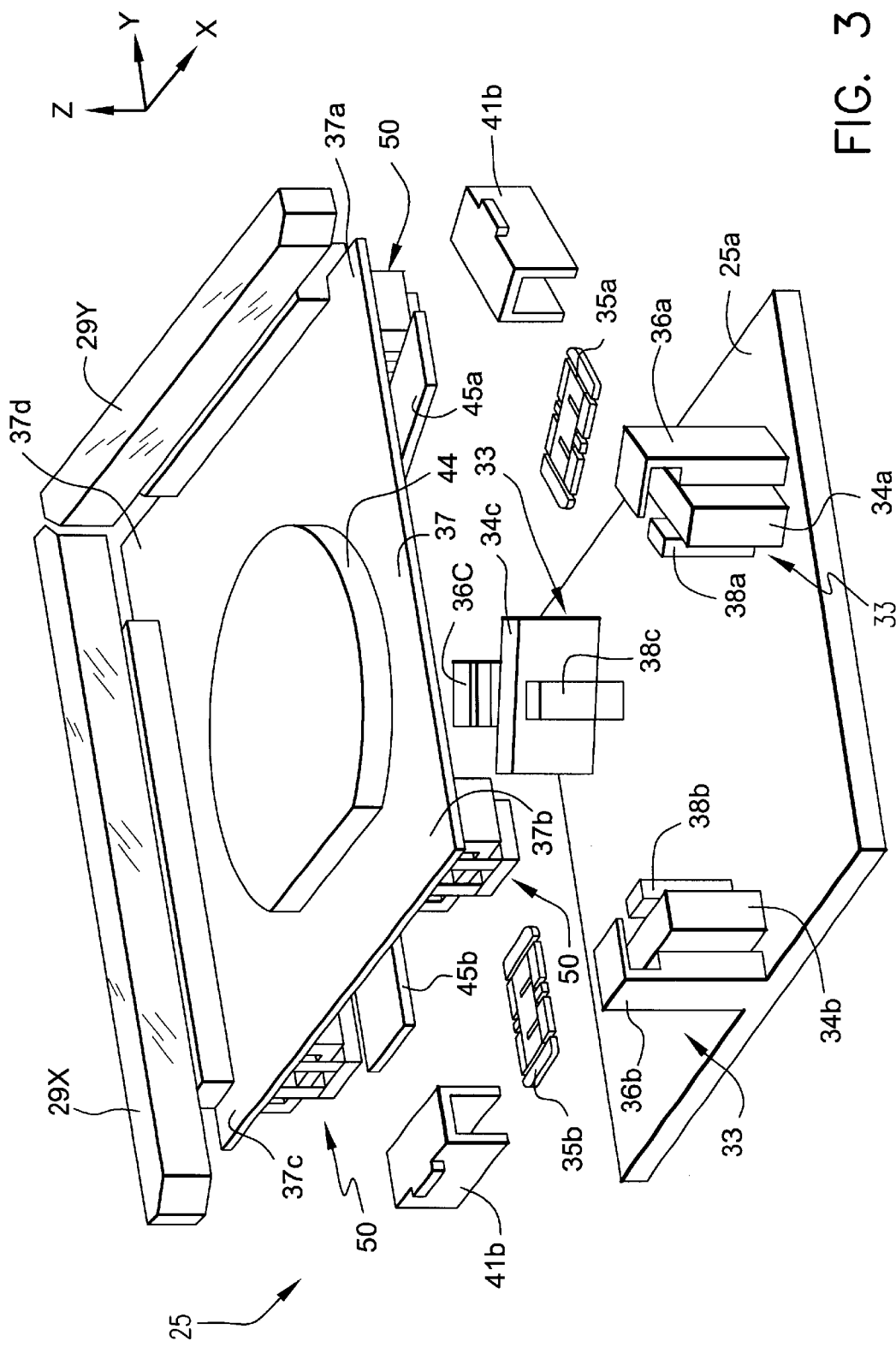
FIG. 3 is an oblique exploded view showing the sample stand 25.
Figure 4:
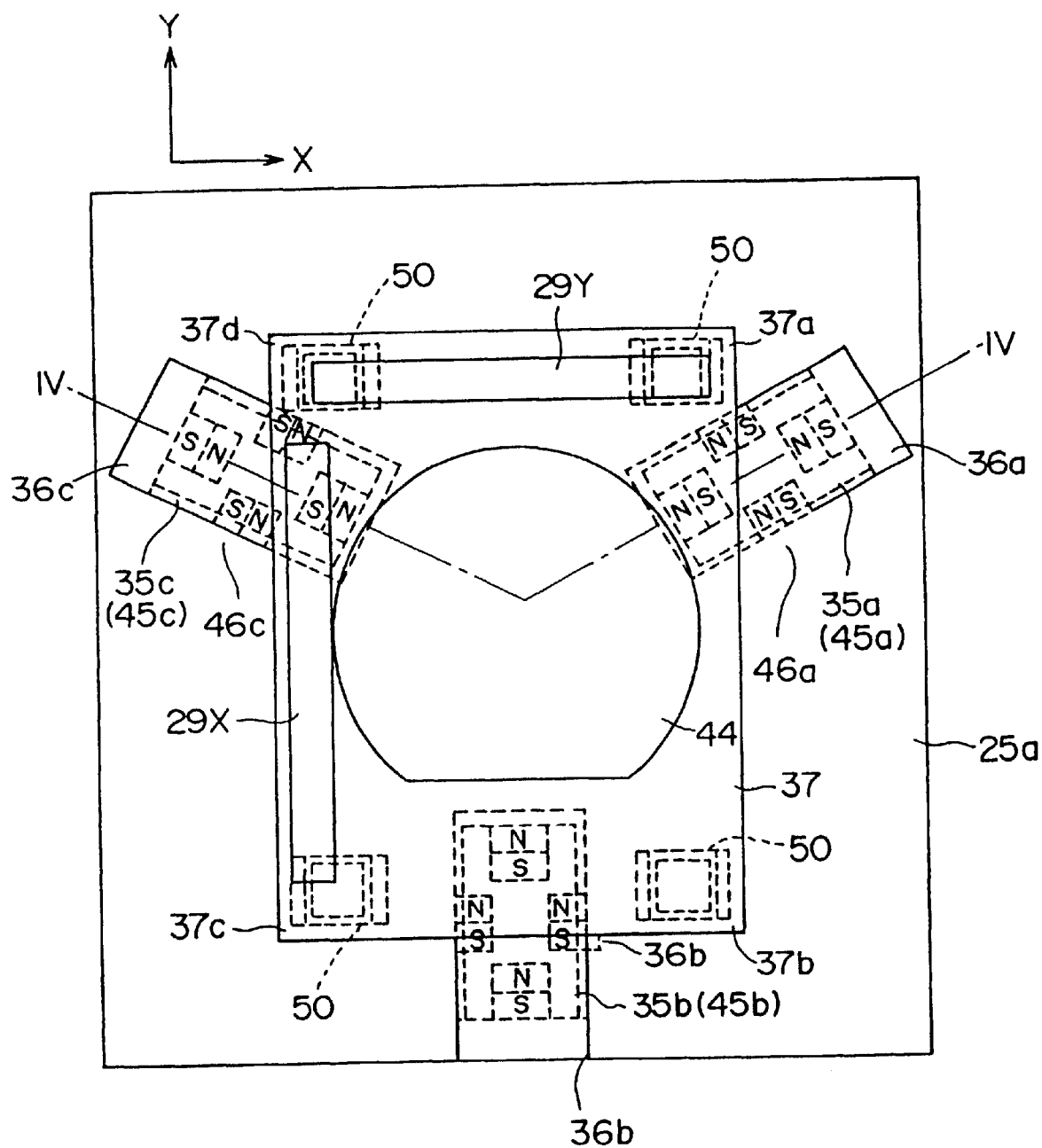
FIG. 4 is a plan view showing the sample stand 25.
Figure 5:
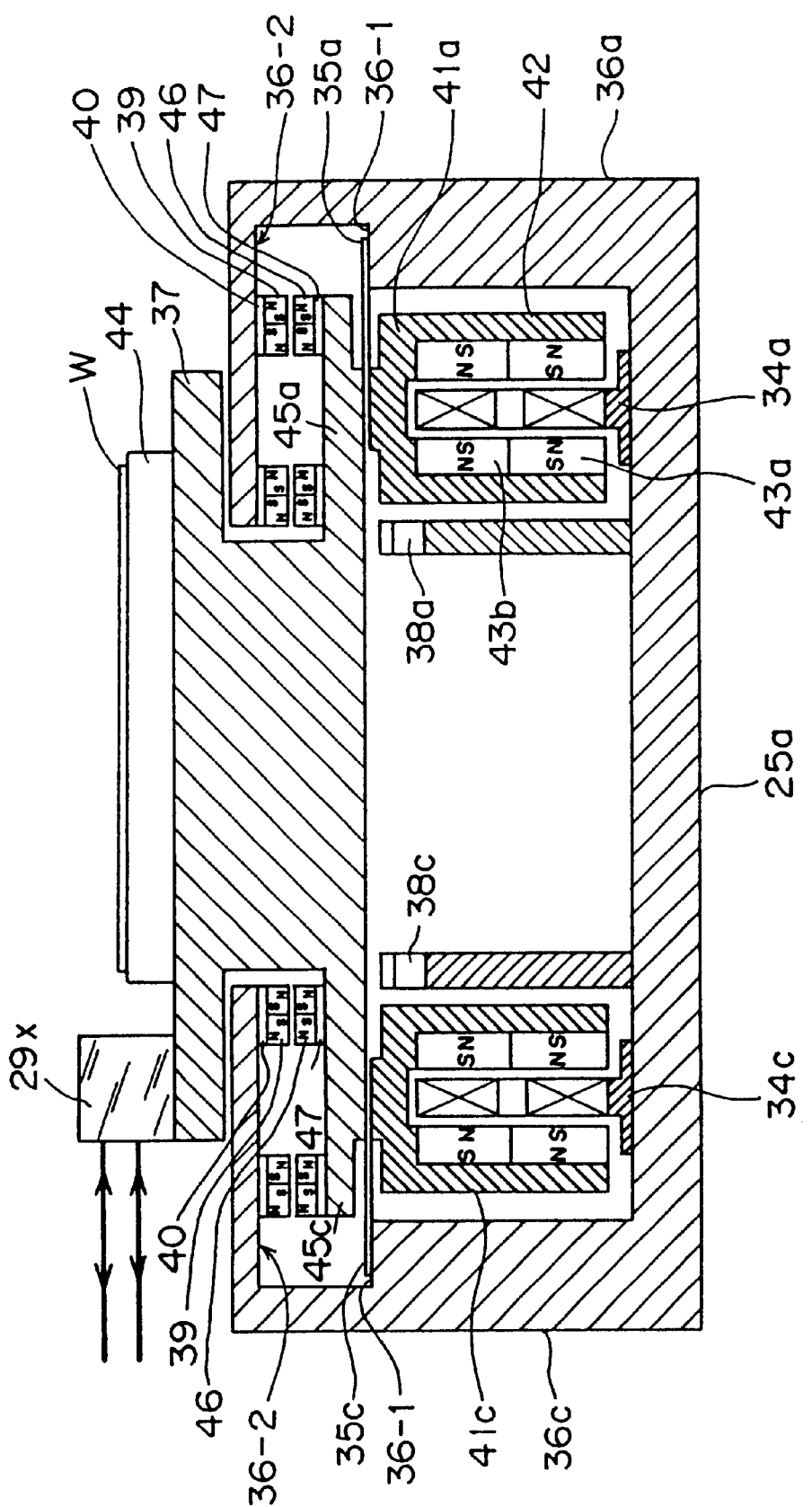
FIG. 5 is a view of the section of the sample table along the line IV through IV shown in FIG. 4.

FIGS. 3 through 5 show the sample stand 25. A base 25*a* is made of ceramics or carbon fiber for rigidity and lightness. Onto the base 25*a*, three stators (single-phase coils) 34*a*, 34*b*, and 34*c* of a bipolar single-phase linear motor unit (hereinafter referred to as LDM) 33, which is a magnetic drive device, are mounted at 120 degree intervals around the base 25*a*. Three fixtures 36*a*, 36*b*, and 36*c* for mounting leaf springs 35*a*, 35*b*, and 35*c* are attached at 120 degree intervals around the base 25*a*. Furthermore, height detectors (for example, a capacitance sensor, etc.) 38*a*, 38*b*, and 38*c* are provided near the stators 34*a*, 34*b*, and 34*c* respectively. The height detectors 38*a*, 38*b*, and 38*c* obtain the displacement of the base 25*a* and the holder table 37 in the Z direction.

The leaf springs 35*a*, 35*b*, and 35*c* and a permanent magnet 39 (of cobalt, nickel, neodymiumiron-boron, etc.) for holding are attached to the fixtures 36*a*, 36*b*, and 36*c*. As shown in FIG. 5, the leaf spring 35*a* is attached to a first plane 36-1 of the fixture 36. The permanent magnet 39 is attached to a second plane 36-2 of the fixtures 36*a*, 36*b*, and 36*c*.

The leaf springs 35*a*, 35*b*, and 35*c* are formed of a rectangular thin metal plate for a spring (for example, stainless steel, etc.), and are screwed to the fixtures 36*a*, 36*b*, and 36*c* respectively, and are screwed to the bottom surfaces of respective projections 45*a*, 45*b*, and 45*c* projecting from the holder table 37. That is, the leaf springs 35*a*, 35*b*, and 35*c* couple the base 25*a* with the holder table 37. The leaf springs 35*a*, 35*b*, and 35*c* are thin and long in the horizontal direction of the leaf springs. Therefore, they are rigid in the X and Y directions, and the rotation direction of the Z axis (hereinafter referred to as the $\omega z$ direction), and are not rigid in the Z direction, the rotation direction of the X axis (hereinafter referred to as the $\omega x$ direction), and the rotation direction of the Y axis (hereinafter referred to as the $\omega y$ direction).

Movable elements 41*a*, 41*b*, and 41*c* of the LDM 33 are arranged as enclosing the stators 34*a*, 34*b*, and 34*c*. Two permanent magnets are arranged in the Z direction. The movable elements 41*a*, 41*b*, and 41*c* are, as shown in FIG. 5, fixed as enclosing with the holder table 37 the leaf springs 35*a*, 35*b*, and 35*c*. The movable elements 41*a*, 41*b*, and 41*c* are fixed at 120 degree intervals on the holder table 37 side corresponding to the stators 34*a*, 34*b*, and 34*c*. The movable elements 41*a*, 41*b*, and 41*c* are formed by permanent magnets 43*a* and 43*b* (of cobalt, nickel, neodymium-iron-boron, etc.), a yoke 42, etc.

Two permanent magnets 43a and 43b are arranged at the movable elements 41a, 41b, and 41c (same as the opposite side enclosing the stators). The N pole of the permanent magnet 43a faces the stator side while the S pole of the permanent magnet 43b faces the stator side. Therefore, the magnetic field is generated in the X direction. The intensity of the magnetic field alters according to the intensity of the permanent magnets 43a and 43b, and by changing the thickness of the yoke 42. When an electric current flows in the direction vertical to the magnetic field, a Lorentz force is generated at the stator, and each of the movable elements 41 starts moving by receiving a downward force in the Z direction.

The holder table 37 is made of ceramics or carbon fibers, and is moved optionally in the Z, ωx, and ωy directions by the electromagnetic induction of the LDM 33. For example, when the same quantity of an electric current I flows through the three stators 34a, 34b, and 34c, the holder table 37 moves up and down in the Z direction in its horizontal state. When no electric current flows through one stator with the same quantity of an electric current flowing through two other stators, the holder table 37 moves (rotates) in the ωx direction, the ωy direction, or the direction of the composite of ωx and ωy. If no current flows through two stators while an electric current flows through another stator, then the holder table 37 moves (rotates) in the direction of the composite of ωx and ωy.

A wafer holder 44 and the moving mirrors 29X and 29Y are mounted on the holder table 37. Permanent magnets 46 are attached through a yoke 47 to the top surfaces of the projections 45a, 45b, and 45c projecting from the holder table 37. The permanent magnets 46 are equally arranged at the projections 45a, 45b, and 45c, and face the respective permanent magnets 39 attached separately as described above. The holder table 37 receives an upward force in the Z direction by the permanent magnets 39 and 46 attracting each other.

Figure 6:
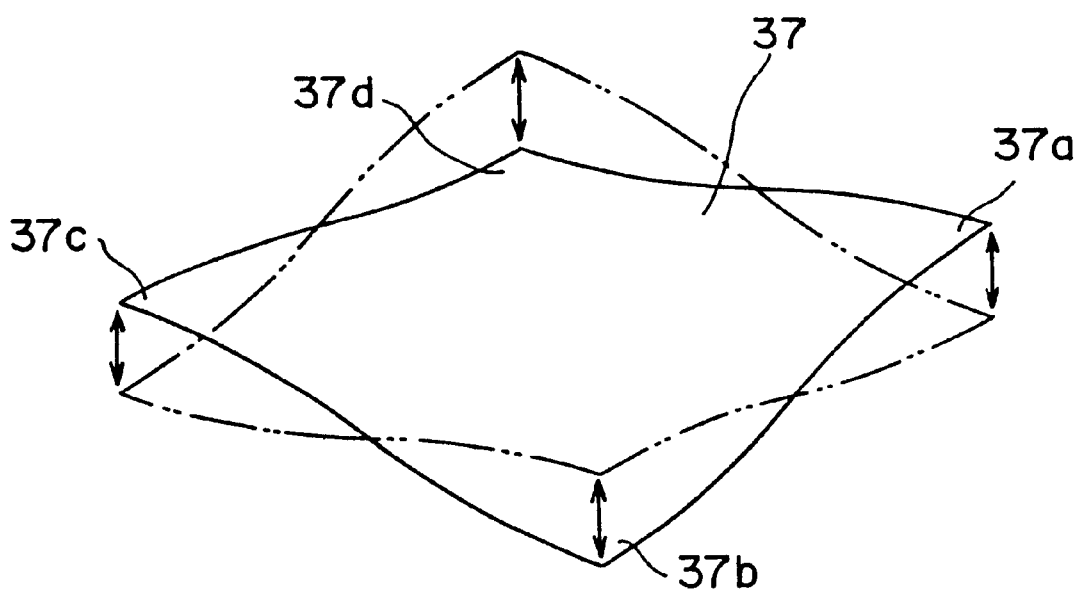
FIG. 6 shows the type of vibration mode generated on a holder table 37.

When the holder table 37 analyzes the vibration mode of the holder table 37, i.e., when the holder table 37 is driven by the electromagnetic drive device, the holder table 37 is waveringly vibrated in the Z direction as shown in FIG. 6, and the four corners 37a, 37b, 37c, and 37d are the antinodes of the vibration. Therefore, the bottom surface of the holder table 37 is provided with a dynamic damper 50 for each of the four corners 37a, 37b, 37c, and 37d.

Figure 7:
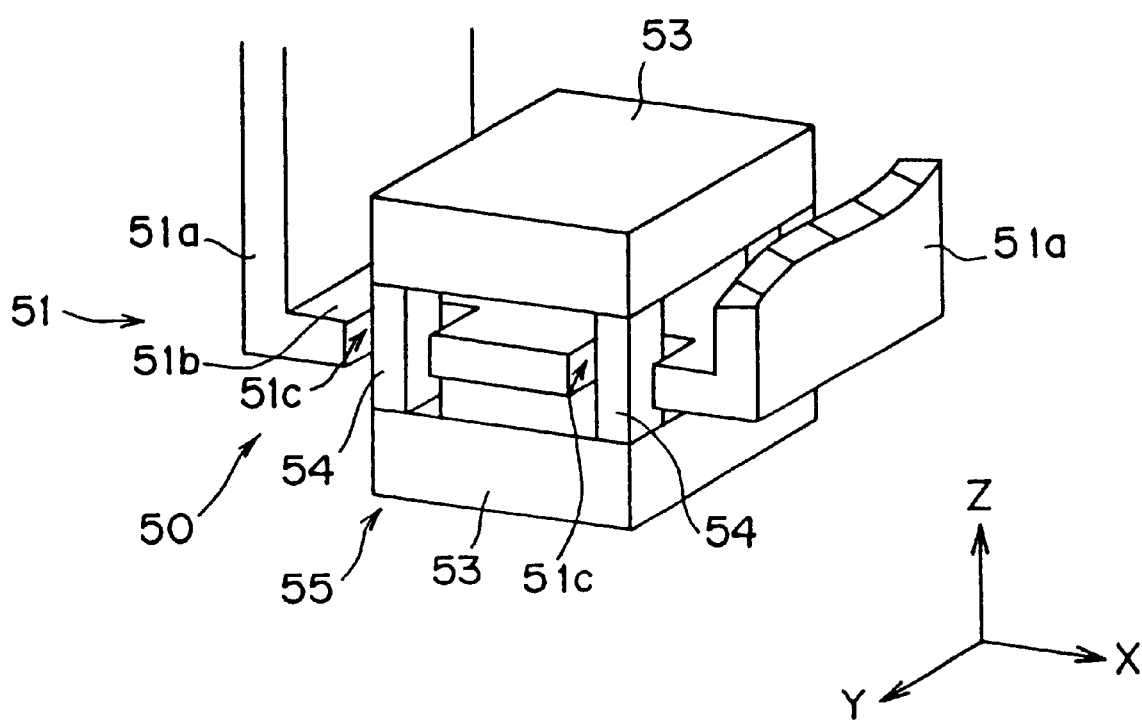
FIG. 7 is an oblique view showing a dynamic damper 50.
Figure 8:
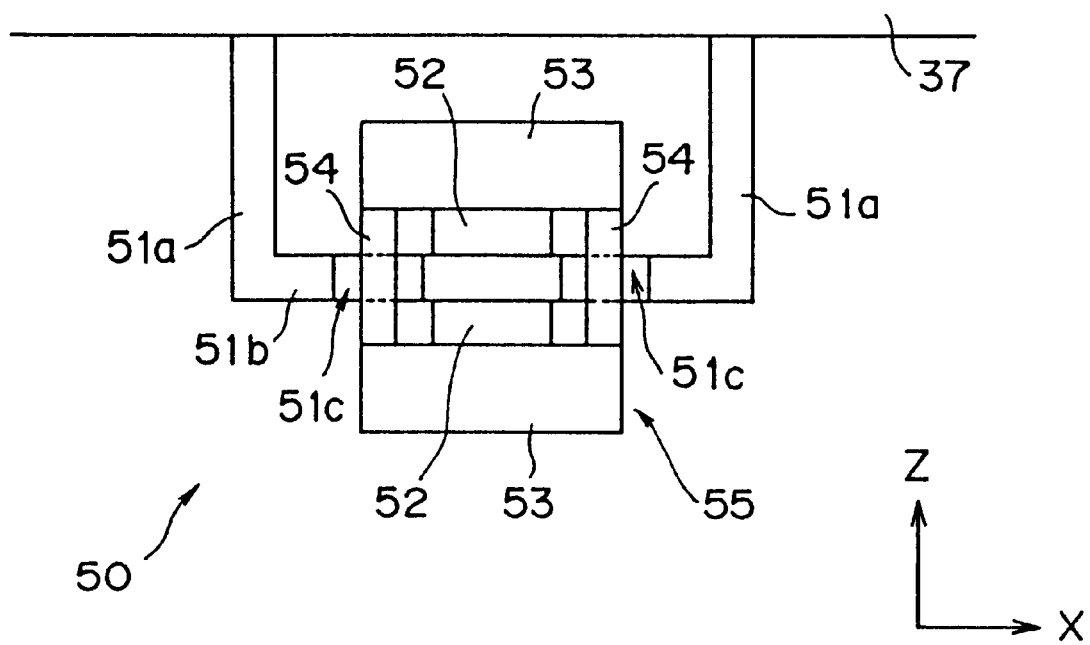
FIG. 8 is a side view of the dynamic damper 50.

As shown in FIGS. 7 and 8, the dynamic damper 50 comprises a base unit 51 attached to the holder table 37; antivibration materials (elastic substances) 52 provided on both sides of the base unit 51 in the Z axis direction; and masses 53 attached to the base unit 51 through each of the antivibration materials 52.

The base unit 51 has the shape of a gate provided with a flat panel 51b between two leg units 51a. The base of the leg unit 51a is attached to the bottom surface of the holder table 37 with the flat panel 51b kept vertical to the Z direction.

The antivibration material 52 is attached to both top and bottom surfaces of the flat panel 51b. The cross section of the antivibration material 52 is square, and is evenly thick in the Z direction. The antivibration material 52 can be made of a material having a relatively large elasticity modulus such as rubber, etc.

The mass 53 is attached to both top and bottom surfaces of the flat panel 51b through the antivibration materials 52. The surface of the mass 53 is rectangular and is larger than the cross section of the antivibration material 52. The mass 53 is a plate which is evenly thick in the Z direction. The masses 53 are coupled with each other by spacers 54, and are formed as the mass body 55 including the mass of the spacers 54. Cutoff units 51c are formed in the base unit 51 so as not to interfere with the spacers 54.

In the above described dynamic damper 50, it is set that the natural frequency of the vibration system including the antivibration material 52 and the mass body 55 in the Z direction is nearly equal to the frequency generated on the holder table 37 in the Z direction during level adjustment. For example, the natural frequency of the dynamic damper 50 in the Z direction is set to be equal to the frequency on the holder table 37 in the Z direction by appropriately selecting the material, shape, mass, etc. of the antivibration material 52 or the material, shape, mass, etc. of the mass body 55.

Figure 9:
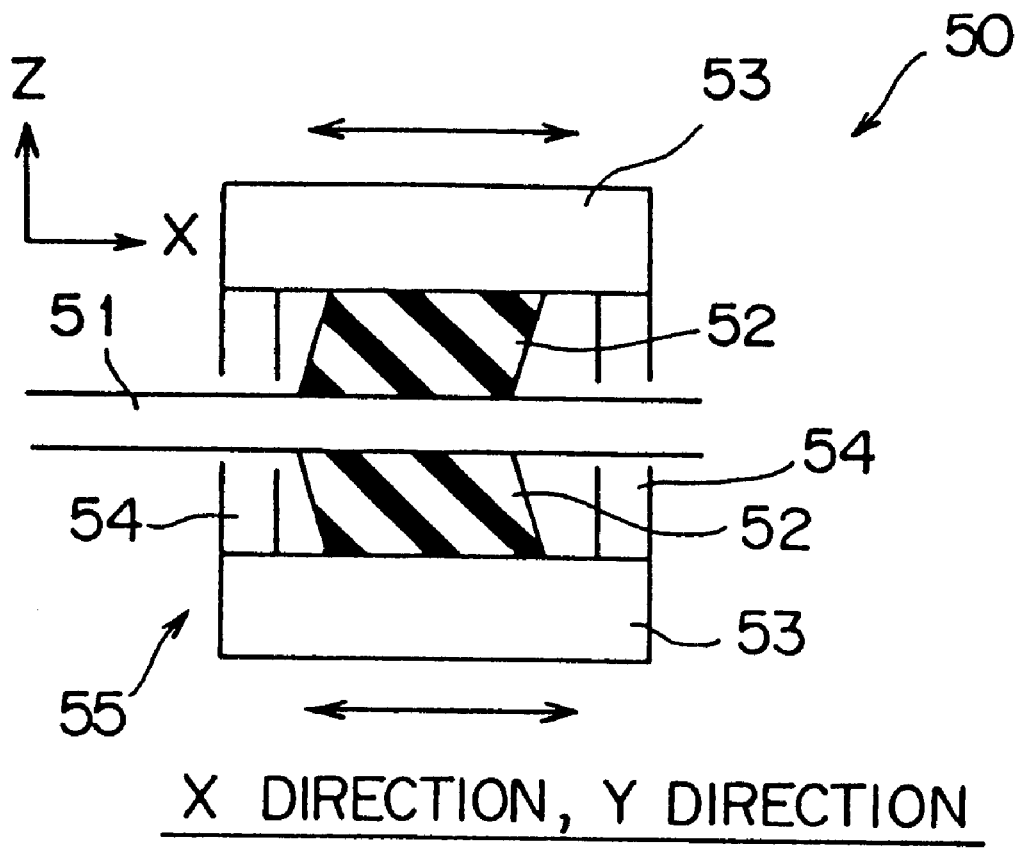
FIG. 9 shows a type of vibration mode generated on the holder table 37 other than the type shown in FIG. 6.
Figure 10:
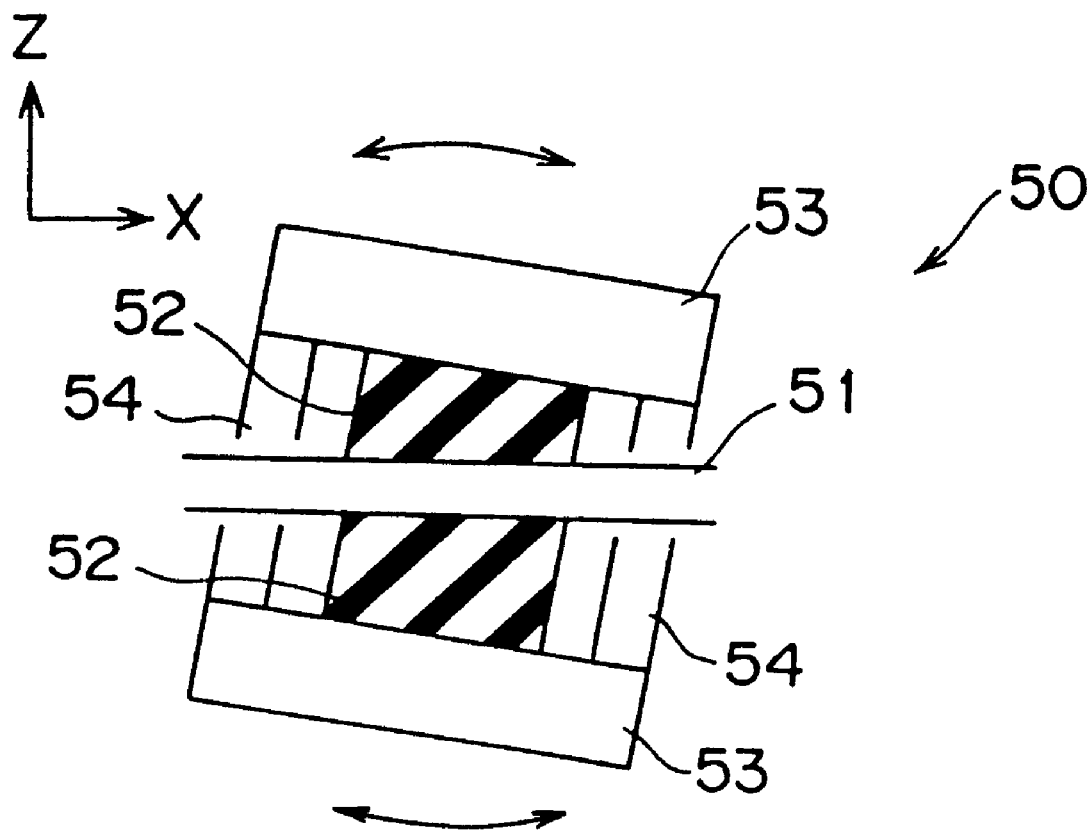
FIG. 10 shows another type of vibration mode generated on the holder table 37 other than the type shown in FIG. 6.
Figure 11:
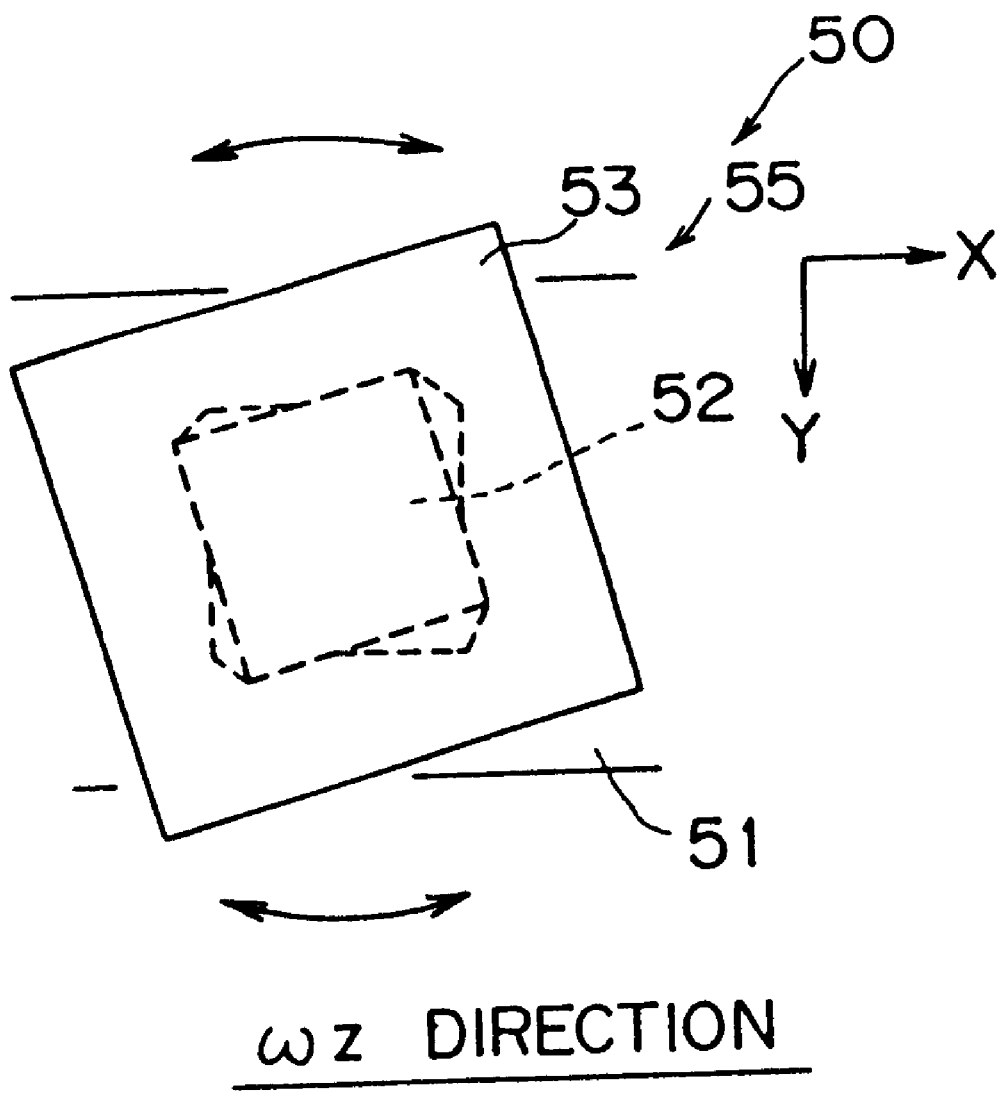
FIG. 11 shows a further type of vibration mode generated on the holder table 37 other than the type shown if FIG. 6.

Since the antivibration material 52 is thicker in the Z direction, and its cross section is narrower than the area of the horizontal plane of the mass 53, the dynamic damper 50 is not rigid in the X, Y, ωx, ωy, and ωz directions, and the vibration system containing the antivibration material 52 and the mass body 55 is easily deformed as shown in FIGS. 9 through 11, thereby lowering the natural frequency in each of the above described directions.

In short, the dynamic damper 50 effectively controls the vibration in the Z direction generated on the holder table 37 during level adjustment, but does not control the vibration in the X, Y, ωx, ωy, and ωz directions so much as in the Z direction. That is, the dynamic damper 50 has an appropriate vibration control effect only in the Z direction, and has no effective vibration control on any other directions.

When the holder table 37 vibrates during level adjustment, the vibration system containing the antivibration material 52 and the mass body 55 is excited in the Z direction. When the vibration system is excited, the vibration energy of the holder table 37 is absorbed by the dynamic damper 50, and the vibration energy of the holder table 37 is decreased, thereby suppressing the vibration. Furthermore, since each of the dynamic dampers 50 is fixed to the corresponding corner 37a, 37b, 37c, or 37d, which is an antinode of the vibration generated on the holder table 37, the vibration generated on the holder table 37 can be effectively suppressed.

Figure 12:
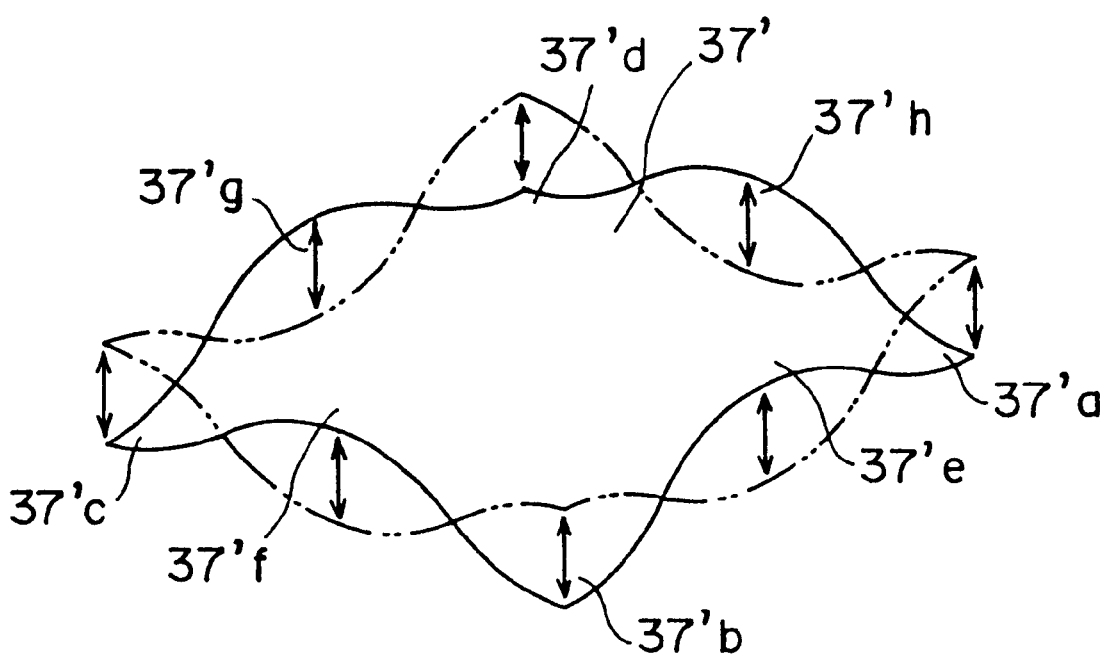
FIG. 12 shows the state of the operation of the dynamic damper 50.

The number and positions of the dynamic dampers 50 are determined by assuming that the four corners of the holder table 37 vibrate up and down as the antinodes of the vibration based on the analysis of the vibration mode of the holder table 37. However, the vibration mode of the holder table 37 is not limited to the state shown in FIG. 6, but can be considered to alter, for example, as shown in FIG. 12, depending on the size, shape, rigidity of the material, weight including the wafer holder 34, etc. Therefore, eight dynamic dampers 50 37'a through 37'h are provided on the holder table 37'. Thus, it is desired that the number and positions of the dynamic dampers 50, and the level of the frequency of the dynamic damper 50 appropriate for more efficient frequency control effect are changed based on the vibration mode of a target holder table.

Figure 13:
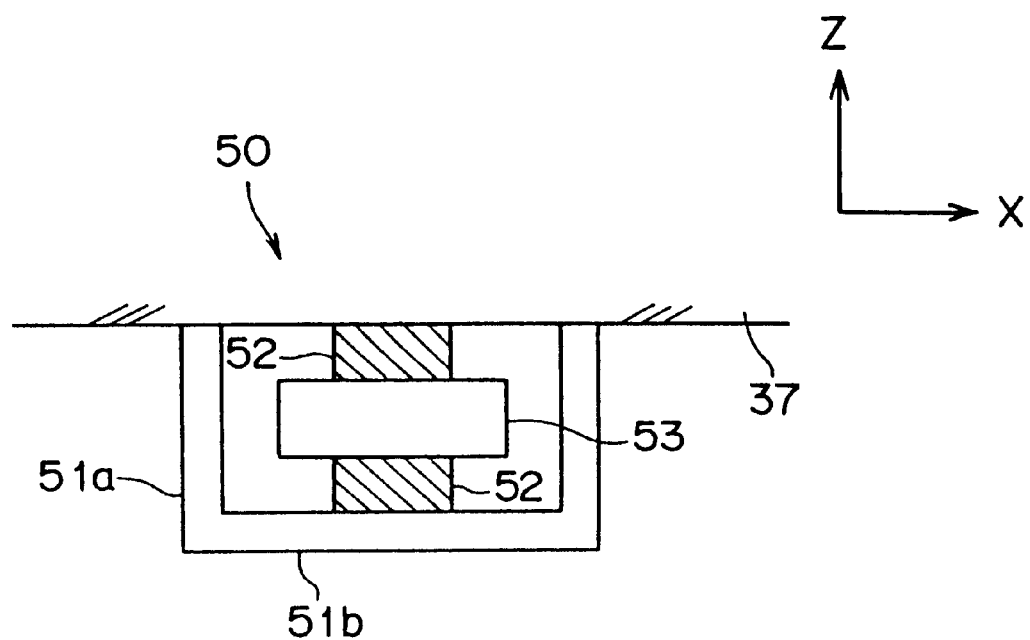
FIG. 13 is a side view showing a variation of the dynamic damper 50.
Figure 14:
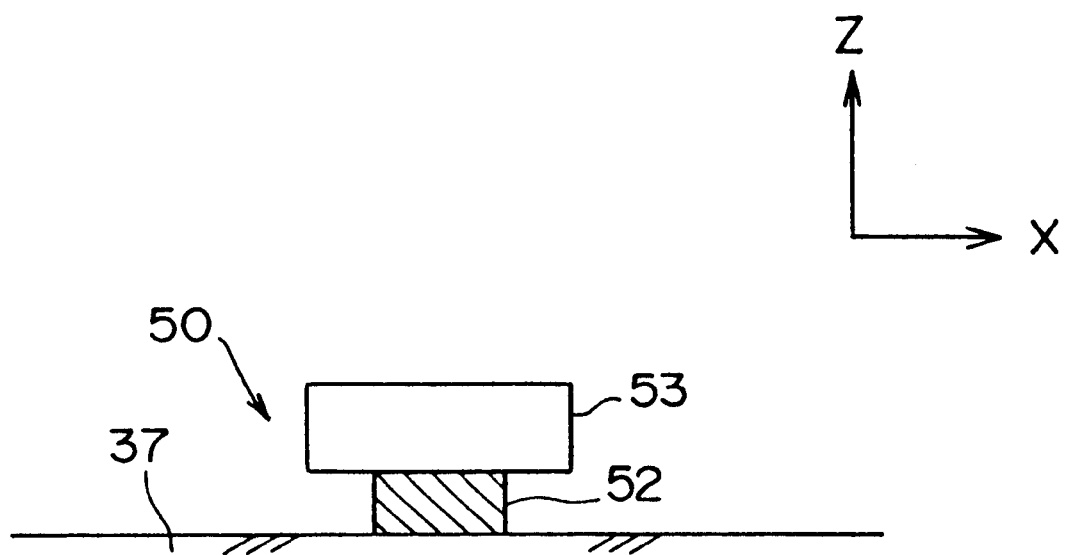
FIG. 14 is a side view showing another variation of the dynamic damper 50.
Figure 15:
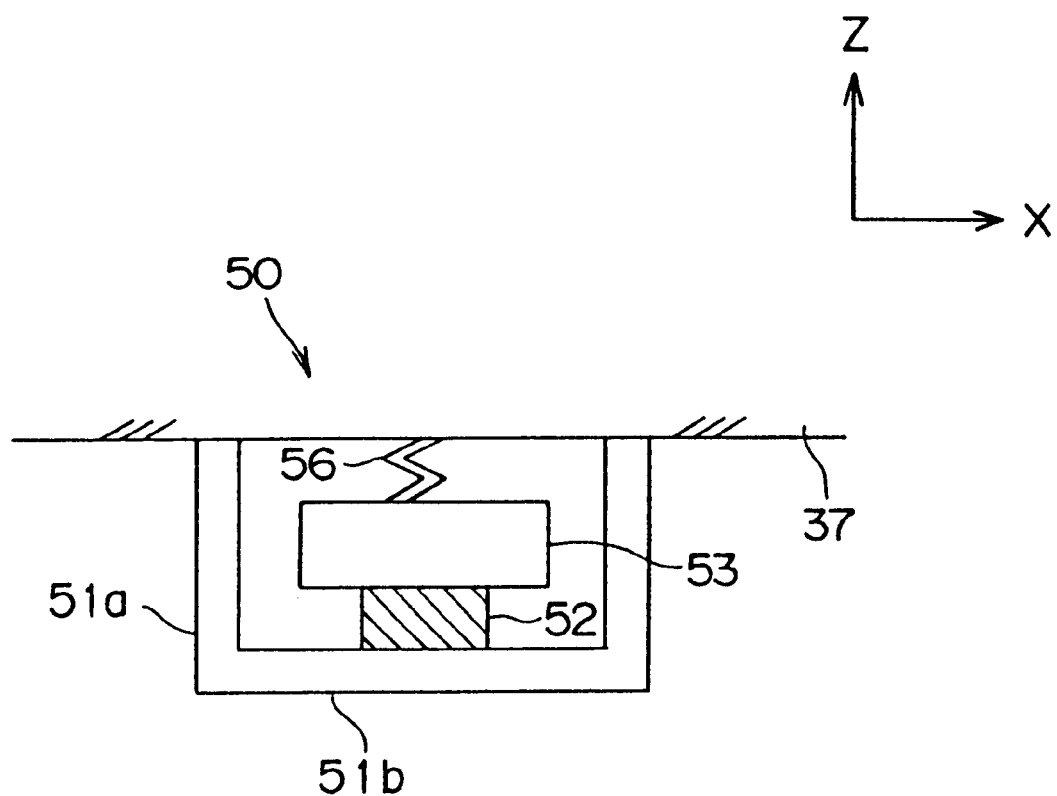
FIG. 15 is a side view showing a further variation of the dynamic damper 50.

Additionally, the dynamic damper 50 can be designed as shown in FIGS. 13 through 15, other than the structure shown by referring to FIGS. 7 and 8. The dynamic damper 50 shown in FIG. 13 is formed by the holder table 37, and the leg unit 51a and the flat panel 51b on both sides of the base unit 51. The masses 53 are attached between the holder table 37 and the flat panel 51b through the antivibration materials 52.

The dynamic damper 50 shown in FIG. 14 is equipped with the holder table 37 over the mass 53 through the antivibration material 52. This configuration also has the function of suppressing the vibration.

The dynamic damper 50 shown in FIG. 15 is realized by forming the antivibration system of the dynamic damper 50 by a rubber antivibration material 52 and a compression spring 56. The elasticity modulus of the antivibration material 52 can be determined by the area, thickness, rigidity, etc. of the antivibration material, but also can be adjusted by the compression spring 56. It can also be applied to the dynamic damper 50 shown in FIGS. 7 and 8.

In the holder table 37, it is necessary to analyze the vibration mode in all of the X, Y, Z, ωx, ωy, and ωz directions including the movement of the XY stage as well as the level adjustment, so that a vibration can be controlled in an optional direction. In this case, the dynamic damper 50 provided for suppressing the vibration in the Z direction has a small influence on the vibration control in other optional directions. Therefore, the vibration control in other directions can be designed without consideration of the influence of the dynamic damper 50 for controlling the vibration in the Z direction.

In the above described embodiment, the dynamic damper 50 is provided for controlling the vibration generated on the holder table 37 in the Z direction. Using a dynamic damper with the similar configuration, the vibration generated on a holder table in other directions can also be suppressed. For example, the vibration generated on the holder table in the X direction can be suppressed by providing a dynamic damper having the natural frequency nearly equal to the frequency generated on the holder table in the X direction. Thus, the vibration generated on the holder table can be controlled to a high degree by controlling the vibration in each direction.

The present invention can be applied to various table support apparatuses, other than an exposure apparatus for production of semiconductor elements, for suppressing the vibration generated on a table.

As described above, the table support apparatus and the exposure apparatus according to the present invention have the following effects.

A vibration can be suppressed without coupling a base with a holder table as in the conventional damper mechanism, by providing a dynamic damper for a holder table supported as movable in at least one optional direction, thereby generating no deformation of the holder table. As a result, the problem of the delay in alignment due to the deformation of the holder table can be solved, thereby largely improving the responsiveness at a level adjustment.

The vibration generated in the moving direction of the holder table can be controlled by providing appropriate rigidity for the dynamic damper in the moving direction of the holder table.

The vibration generated in the moving direction of the holder table can be controlled by the vibration system comprising an elastic substance and a mass body and the vibration of the holder table can be successfully damped by designing a dynamic damper as comprising a base unit attached to a holder table; the elastic substances which have appropriate rigidity in the moving direction of the holder table and are attached to the base unit on both sides of the holder table in the moving direction; and the mass body for attaching the base unit through the elastic substances on both sides of the moving directions of the holder table so that the mass body can be coupled with the base unit.

Furthermore, the damping performance can be reduced by setting a lower rigidity against the horizontal vibration generated on the holder table by, for example, the operation of the XY state, and against the rotation vibration from a vertical axis, by appropriately selecting the shape or material of the elastic substance in the above described dynamic damper. In the holder table, it is necessary to analyze the vibration mode in six optional directions including the movement of the XY state as well as the level adjustment so that the vibration can be controlled in each of the optional directions. If the above described dynamic damper is adopted, the vibration can be effectively controlled in a predetermined direction, and the vibration is not controlled so much as in directions other than the predetermined direction. As a result, even if the vibration is controlled in one direction, it does not have a large influence on the vibration control in other directions, thereby easily controlling the vibration of the holder table in each direction to a high degree.

The vibration of the holder table can be more effectively controlled by fixing the dynamic damper to the antinode of the vibration generated on the holder table.

The exposure apparatus according to the present embodiment can be a step and repeat type exposure apparatus for exposing a pattern of a mask with the mask and the wafer set still and sequentially moving the wafer step by step as well as a scanning type exposure apparatus for exposing a pattern of a mask by synchronously moving the mask and a base panel.

The application of the exposure apparatus is not limited to an exposure apparatus for producing a semiconductor element. For example, it can be applied to a liquid crystal exposure apparatus for exposing a liquid crystal display element pattern to a rectangular glass plate, and to an exposure apparatus for producing a thin film magnetic head.

Furthermore, the light source of the exposure apparatus according to the present embodiment can be a charged particle ray such as an X-ray, an electron beam, etc. as well as a g-ray (436 nm), i-ray (365 nm), KrF excimer laser (248 nm), ArF excimer laser (193 nm), F2 laser (157 nm), etc. For example, when an electron beam is used, thermoelectron radiative lanthanum hexavalent ($LaB_6$) and tantalum (Ta) can be used as an electron gun.

The exposure apparatus according to the present embodiment can be produced by incorporating an illuminating optical system comprising a plurality of lenses and a projection optical system into the body of the exposure apparatus to make an optical adjustment, connecting a wire and a pipe by attaching a reticle stage and wafer stage comprising a number of mechanical parts to the body of the exposure apparatus, and performing a general adjustment (electric adjustment, operation confirmation, etc.). The assembly of the wafer stage includes a process of attaching a dynamic damper according to the present embodiment.

It is desired that the exposure apparatus is produced in a clean room in which the temperature and the cleanliness are well maintained.

What is claimed is:

1. A table support apparatus, comprising:

a table movable in at least one optional direction, the table being subject to vibration and having a natural frequency; and a dynamic damper provided for said table, said dynamic damper being configured with physical characteristics such that a natural frequency of said dynamic damper is approximately equal to the natural frequency of said table.

2. The apparatus according to claim 1, wherein, said dynamic damper has rigidity appropriate for damping a vibration in at least the optional direction.

3. The apparatus according claim 2, wherein points on said table corresponding to antinodes of the vibration are determined according to an analysis of a table vibration mode, and wherein said dynamic damper is fixed to at least one of the antinodes of the vibration generated on said table.

4. The apparatus according to claim 2, wherein, said dynamic damper comprises:
   a base unit attached to said table;
   elastic substances which have appropriate rigidity in the optional direction and are attached to said base unit on both sides in the optional direction; and
   a mass body attached to said base unit through each of said elastic substances on both sides in the optional direction for integration into a single structure.

5. The apparatus according to claim 4, wherein points on said table corresponding to antinodes of the vibration are determined according to an analysis of a table vibration mode, and wherein said dynamic damper is fixed to at least one of the antinodes of the vibration generated on said table.

6. The apparatus according to claim 1, wherein points on said table corresponding to antinodes of the vibration are determined according to an analysis of a table vibration mode, and wherein said dynamic damper is fixed to at least one of the antinodes of the vibration generated on said table.

7. An exposure apparatus, comprising:
   a table movable in at least a first direction with an object planed thereon, the table being subject to vibration and having a natural frequency; and
   a dynamic damper provided for said table to damp the vibration generated on said table, said dynamic damper being configured with physical characteristics such that a natural frequency of said dynamic damper is approximately equal to the natural frequency of said table.

8. The apparatus according to claim 7, wherein, said dynamic damper has rigidity appropriate for damping the vibration in at least the first direction.

9. The apparatus according to claim 8, wherein points on said table corresponding to antinodes of the vibration are determined according to an analysis of a table vibration mode, and wherein said dynamic damper is fixed to at least one of the antinodes of the vibration generated on said table.

10. The apparatus according to claim 8, wherein, said dynamic damper comprises:
    a base unit attached to said table;
    elastic substances which have appropriate rigidity in the first direction and are attached to said base unit on both sides in the first direction; and
    a mass body attached to said base unit through each of said elastic substances on both sides in the first direction for integration into a single structure.

11. The apparatus according to claim 10, wherein points on said table corresponding to antinodes of the vibration are determined according to an analysis of a table vibration mode, and wherein said dynamic damper is fixed to at least one of the antinodes of the vibration generated on said table.

12. The apparatus according to claim 7, wherein points on said table corresponding to antinodes of the vibration are determined according to an analysis of a table vibration mode, and wherein said dynamic damper is fixed to at least one of the antinodes of the vibration generated on said table.

13. The apparatus according to claim 7, wherein, said object is a wafer.

14. A method of producing an exposure apparatus for exposing a pattern, comprising the steps of:
    holding an object, and providing a table movable in at least a first direction, the table being subject to vibration and having a natural frequency; and
    providing a dynamic damper attached to said table to damp a vibration generated on said table, and configuring said dynamic damper with physical characteristics such that a natural frequency of said dynamic damper is approximately equal to the natural frequency of said table.

15. The method according to claim 14, wherein, said dynamic damper has rigidity appropriate to damp a vibration in at least the first direction.

16. The method according to claim 14, wherein, said object is a wafer.

17. The method according to claim 14, wherein, said exposure apparatus is a scanning type exposure apparatus for exposing the pattern while moving said object.

18. An object on which a pattern has been formed by the exposure apparatus produced by the method according to claim 14.

19. An exposure apparatus, comprising:
    an exposure device having a plurality of units to expose a pattern onto an object, the units being subject to vibration and having a natural frequency; and
    a dynamic damper provided for at least one of said units to damp the vibration generated on said at least one of said units, said dynamic damper being configured with physical characteristics such that a natural frequency of said dynamic damper is approximately equal to the natural frequency of said at least one of said units.

20. The apparatus according to claim 19, wherein said plurality of units comprise a stage unit to hold said object.

21. The apparatus according to claim 20, wherein said dynamic damper is provided for said stage unit.

22. The apparatus according to claim 21, wherein at least part of said stage unit is made of a ceramic.

23. An exposure apparatus that exposes a pattern onto an object, comprising:
    a table having a surface to hold said object;
    a driver connected to said table, said driver moving said table at least in a first direction perpendicular to said surface such that said table is subject to vibration, said table having a natural frequency; and
    a dynamic damper provided for said table to damp the vibration caused by movement of said table in the first direction.

24. The apparatus according to claim 23, wherein said dynamic damper is configured with physical characteristics such that a natural frequency of said dynamic damper is approximately equal to the natural frequency of said table.

25. The apparatus according to claim 23, wherein points on said table corresponding to antinodes of the vibration are determined according to an analysis of a table vibration mode, and wherein said dynamic damper is fixed to at least one of the antinodes of the vibration generated on the table.

* * * * *